United States Patent
Nagumo et al.

(10) Patent No.: US 9,188,616 B2
(45) Date of Patent: Nov. 17, 2015

(54) MODULE AND CAPACITANCE DETECTING METHOD

(71) Applicant: MURATA MANUFACTURING CO., LTD., Nagaokakyo-Shi, Kyoto-Fu (JP)

(72) Inventors: Shoji Nagumo, Nagaokakyo (JP); Masashi Nakazato, Nagaokakyo (JP); Yujie Dai, Tianjin (CN); Xiaoxing Zhang, Tianjin (CN); Yingjie Lu, Tianjin (CN)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 14/509,896

(22) Filed: Oct. 8, 2014

(65) Prior Publication Data

US 2015/0084652 A1    Mar. 26, 2015

Related U.S. Application Data

(63) Continuation of application No. PCT/CN2012/076262, filed on May 30, 2012.

(51) Int. Cl.
*G01R 27/26* (2006.01)
*H03K 17/955* (2006.01)

(52) U.S. Cl.
CPC .......... *G01R 27/2605* (2013.01); *H03K 17/955* (2013.01); *H03K 2217/960745* (2013.01)

(58) Field of Classification Search
CPC . G01R 27/2605; G01R 27/02; G01R 31/3008
See application file for complete search history.

(56) References Cited

U.S. PATENT DOCUMENTS

| 4,039,940 A | 8/1977 | Butler et al. |
| 7,830,157 B2 | 11/2010 | Geaghan |

(Continued)

FOREIGN PATENT DOCUMENTS

| CN | 101082644 A | 12/2007 |
| CN | 101578526 A | 11/2009 |

(Continued)

OTHER PUBLICATIONS

Japanese Office Action, mail date May 7, 2015, corresponding application JP 2015-510604 (English translation attached).

(Continued)

*Primary Examiner* — Tung X Nguyen
*Assistant Examiner* — Alessa Allgood
(74) *Attorney, Agent, or Firm* — Arent Fox LLP

(57) ABSTRACT

A capacitance detecting circuit includes a constant current source supplying a constant current to a voltage detection point, a time measuring unit measuring time of charge until the voltage of the voltage detection point reaches a prescribed voltage, a storage unit and an operation unit. The storage unit stores first data obtained in advance concerning the time of charge of a capacitance element having a known capacitance value, and second data obtained in advance concerning the time of charge of a capacitance component. The operation unit generates third data representing the time of charge of an object of detection from a difference between the first measurement value of the time measuring unit when the capacitance component is connected to the voltage detection point and the second data, and based on the ratio between the third data and the first data and the known capacitance value, calculates the capacitance value of the object of detection.

14 Claims, 12 Drawing Sheets

(56) References Cited

U.S. PATENT DOCUMENTS

| | | | |
|---|---|---|---|
| 2007/0145981 A1* | 6/2007 | Tomita et al. | 324/509 |
| 2007/0194800 A1 | 8/2007 | Novikov et al. | |
| 2008/0122457 A1* | 5/2008 | Taguchi | 324/679 |
| 2008/0169826 A1 | 7/2008 | Bartling | |
| 2011/0050255 A1 | 3/2011 | Iriarte et al. | |
| 2013/0207711 A1* | 8/2013 | Ikeda et al. | 327/378 |

FOREIGN PATENT DOCUMENTS

| | | | | |
|---|---|---|---|---|
| CN | 101910850 A | 12/2010 | | |
| JP | S56107170 A | 8/1951 | | |
| JP | H02271266 A | 11/1990 | | |
| JP | 6-242159 A * | 9/1994 | | G01R 27/26 |
| JP | H06-242159 A | 9/1994 | | |
| JP | 2007-57402 A | 3/2007 | | |

OTHER PUBLICATIONS

PCT International Search Report issued in PCT/CN2012/076262, mailed on Mar. 7, 2013.
PCT Notification of the Recording of a Change issued in PCT/CN2012/076262.
Written Opinion issued in PCT/CN2012/076262, mailed on Mar. 7, 2013.
Japanese Office Action issued for corresponding application JP2015-510604, mailing date Jul. 21, 2015.

* cited by examiner

FIG.14

| FREQUENCY | TRIMMING CODE |
|---|---|
| fosc0 | D |

48a

| CAPACITANCE VALUE | CHANNEL 1 | CHANNEL 2 |
|---|---|---|
| | SPI1e | SPI2e |
| C3 | | |
| | SPI1d | SPI2d |
| C2 | | |
| | SPI1c | SPI2c |
| C1 | | |
| | SPI1b | SPI2b |
| C0 | | |
| | SPI1a | SPI2a |

48b

| CAPACITANCE VALUE | CHANNEL 1 | CHANNEL 2 |
|---|---|---|
| | | |

50

| CAPACITANCE VALUE | COUNT VALUE |
|---|---|
| Ck | $\Delta N0'$ |

| TERMINAL | COUNT VALUE |
|---|---|
| CIN | N1 |
| CREF | N2 |

MODULE AND CAPACITANCE DETECTING METHOD

TECHNICAL FIELD

The present application is a continuation of PCT/CN2012/076262 filed May 30, 2012.

The present invention relates to a module for detecting capacitance value of an object of detection, as well as to a method of detecting capacitance value of an object of detection.

BACKGROUND ART

Devices for measuring electrostatic capacitance of a capacitor are disclosed, for example, in Japanese Patent Laying-Open Nos. 56-107170 (Patent Literature 1) and 2-271266 (Patent Literature 2). The device disclosed in Japanese Patent Laying-Open No. 56-107170 includes a power supply and a DC current measuring device. The power supply increases voltage with time at a known constant rate. The power supply and the DC current measuring device are connected in series to terminals of a capacitor. From the measured current value, electrostatic capacitance of the capacitor is calculated.

The device disclosed in Japanese Patent Laying-Open No. 2-271266 includes a DC power supply, a resistor connected between the DC power supply and a capacitor, a current detecting circuit for detecting a current flowing through the resistor, an integrating circuit for integrating charging current detected by the current detecting circuit, and an operation output unit. The operation output unit calculates electrostatic capacitance of the capacitor based on the integrated value obtained by the integrating circuit and the voltage across the capacitor terminals.

SUMMARY OF INVENTION

Technical Problem

A capacitance component having a large capacitance value often exists on a path from a detection terminal to an object of detection. The capacitance value of the capacitance component may vary device by device. If variation of capacitance component is comparable to the variation width of capacitance value of the object of detection, it becomes difficult to detect the variation in capacitance value of the object of detection.

An object of the present invention is to provide a technique for detecting capacitance value of an object of detection with high accuracy.

Solution to Problem

According to an aspect, the present invention provides a module including a current path and a capacitance detecting circuit. The current path is connected to an object of detection and includes a capacitance component. The capacitance detecting circuit supplies a constant current to the object of detection through the current path, and thereby detects a capacitance value of the object of detection. The capacitance value detecting circuit includes:

(1) a constant current source supplying said constant current to a voltage detection point;

(2) a storage unit storing: (a) first data, obtained in advance of said determination of said capacitance value, concerning a time it takes to charge a capacitance element having a known capacitance value to said prescribed voltage when said constant current is applied to said capacitance element and (b) second data, obtained in advance of said detection of said capacitance value, concerning a time it takes to charge said capacitance component to said prescribed voltage when said constant current is applied to said capacitive component;

(3) a charge/discharge circuit connecting said current path to said voltage detection point to charge both said object of detection and said capacitance component, and disconnecting said current path from said voltage detection point to discharge both said object of detection and said capacitance component;

(4) a time measuring circuit generating a third data indicative of a time it takes to charge said object of detection and said capacitance component with said constant current to cause said voltage detection point to attain said prescribed voltage; and (5) an operation unit:
  (a) generating fourth data representing a time it takes to charge said object of detection from a difference between said third data and said second data; and
  (b) calculating a capacitance value of said object of detection based on a ratio between said third data and said first data.

Preferably, the time measuring unit includes an oscillator and a counter. The counter generates a count value as the third data in response to an output signal from the oscillator. The storage unit stores in advance an initial value of oscillation frequency of the oscillator and an initial value of the first data. The operation unit corrects the initial value of the first data in accordance with a ratio between the initial value of the oscillation frequency and a measured value of the oscillation frequency, to update the first data.

Preferably, the module further includes a reference capacitance element. The charge/discharge circuit connects the reference capacitance element to the voltage detection point to charge the reference capacitance element. The charge/discharge circuit also disconnects the reference capacitance element from the voltage detection point to discharge the reference capacitance element. The time measuring unit measures the time of charge of the reference capacitance element to output a second measurement value. The storage unit stores in advance fourth data obtained in advance as the time of charge of the reference capacitance element. The operation unit corrects the first measurement value based on a ratio between the second measurement value and the fourth data.

Preferably, the storage unit stores a relationship between information indicating types of control signals and the capacitance value of the object of detection. The operation unit generates a control signal based on a calculated capacitance value and the relationship stored in the storage unit. The capacitance detecting circuit further includes an interface circuit for outputting the calculated capacitance value and the control signal.

According to another aspect, the present invention provides a capacitance detecting method of detecting a capacitance value of an object of detection connected to a current path including a capacitance component, including the acts of:

supplying a constant current to a voltage detection point;

storing: (a) first data, obtained in advance of said determination of said capacitance value, concerning a time it takes to charge a capacitance element having a known capacitance value to said prescribed voltage when said constant current is applied to said capacitance element and (b) second data, obtained in advance of said detection of said capacitance value, concerning a time it takes to charge said capacitance component to said prescribed voltage when said constant current is applied to said capacitive component;

connecting said current path to said voltage detection point to charge both said object of detection and said capacitance component, and subsequently disconnecting said current path from said voltage detection point to discharge both said object of detection and said capacitance component;

generating a third data indicative of a time it takes to charge said object of detection and said capacitance component with said constant current to cause said voltage detection point to attain said prescribed voltage;

generating fourth data representing a time it takes to charge said object of detection from a difference between said third data and said second data; and calculating a capacitance value of said object of detection based on a ratio between said third data and said first data.

Preferably, at the act of measuring, the time of charge is measured by an oscillator and a counter generating a count value in response to an output signal from the oscillator. The capacitance detecting method further includes the acts of storing in advance an initial value of an oscillation frequency of the oscillator and an initial value of the first data; and correcting the initial value of the first data in accordance with a ratio between the initial value of the oscillation frequency and a measured value of the oscillation frequency.

Preferably, the capacitance detecting method further includes the acts of storing in advance fourth data obtained in advance as the time of charge of a reference capacitance element; supplying the constant current to the voltage detection point to charge the reference capacitance element; and measuring the time of charge of the reference capacitance element to generate a second measurement value. The step of generating the third data includes the step of correcting the first measurement value based on a ratio between the second measurement value and the fourth data.

Advantageous Effects of Invention

The present invention enables highly accurate detection of a capacitance value of an object of detection.

BRIEF DESCRIPTION OF DRAWINGS

FIG. 14 shows a configuration of a storage unit of the capacitance detecting circuit in accordance with the second embodiment of the present invention.

DESCRIPTION OF EMBODIMENTS

Figure 1:
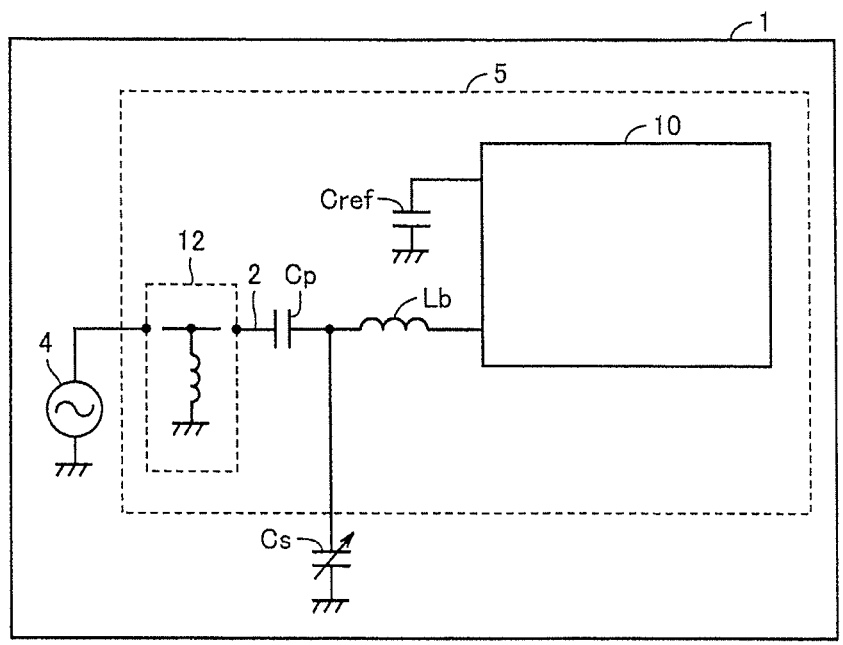
FIG. 1 is a block diagram showing a schematic configuration of electronic equipment mounting a module in accordance with a first embodiment of the present invention.

In the following, embodiments of the present invention will be described in detail with reference to the figures. In the figures, the same or corresponding portions are denoted by the same reference characters and description thereof will not be repeated.

Embodiment 1

FIG. 1 is a block diagram showing a schematic configuration of electronic equipment mounting a module in accordance with a first embodiment of the present invention. Referring to FIG. 1, electronic equipment 1 includes a high-frequency power supply 4 and a module 5.

Module 5 includes a capacitance detecting circuit 10, a reference capacitance element Cref, a signal line 2, and a matching circuit 12. Reference capacitance element Cref is electrically connected to capacitance detecting circuit 10.

Signal line 2 is connected between high frequency power supply 4 and capacitance detecting circuit 10. Signal line 2 includes a capacitance component Cp and an inductor Lb. Capacitance component Cp and inductor Lb are connected in series. Capacitance component Cp passes a high-frequency signal, while it shuts-off DC flow. Inductor Lb passes DC component, while it blocks entrance of high-frequency component to capacitance detecting circuit 10.

The object of detection Cs is connected to signal line 2. Therefore, object of detection Cs and capacitance component Cp are electrically connected in parallel with capacitance detecting circuit 10.

Capacitance detecting circuit 10 supplies a constant current to object of detection Cs through signal line 2, and detects the capacitance value of object of detection Cs. In the present embodiment, signal line 2 is a current path supplying constant current to object of detection Cs. Object of detection Cs has its capacitance value changed. It is noted, however, that the capacitance value of object of detection Cs may be fixed.

Matching circuit 12 is formed by a combination of an inductor, a fixed capacitance element and a variable capacitance element. In the present embodiment, in order to detect the capacitance value of object of detection Cs, a constant current is supplied to capacitance component Cp and object of detection Cs, so that object of detection Cs and capacitance component Cp are charged. The inductor serves to apply the ground potential to capacitance component Cp when capacitance component Cp and object of detection Cs are charged. In FIG. 1 and in the following figures described below, only the inductor among the components of matching circuit 12 is shown as an element related to detection of capacitance value of object of detection Cs.

Figure 2:
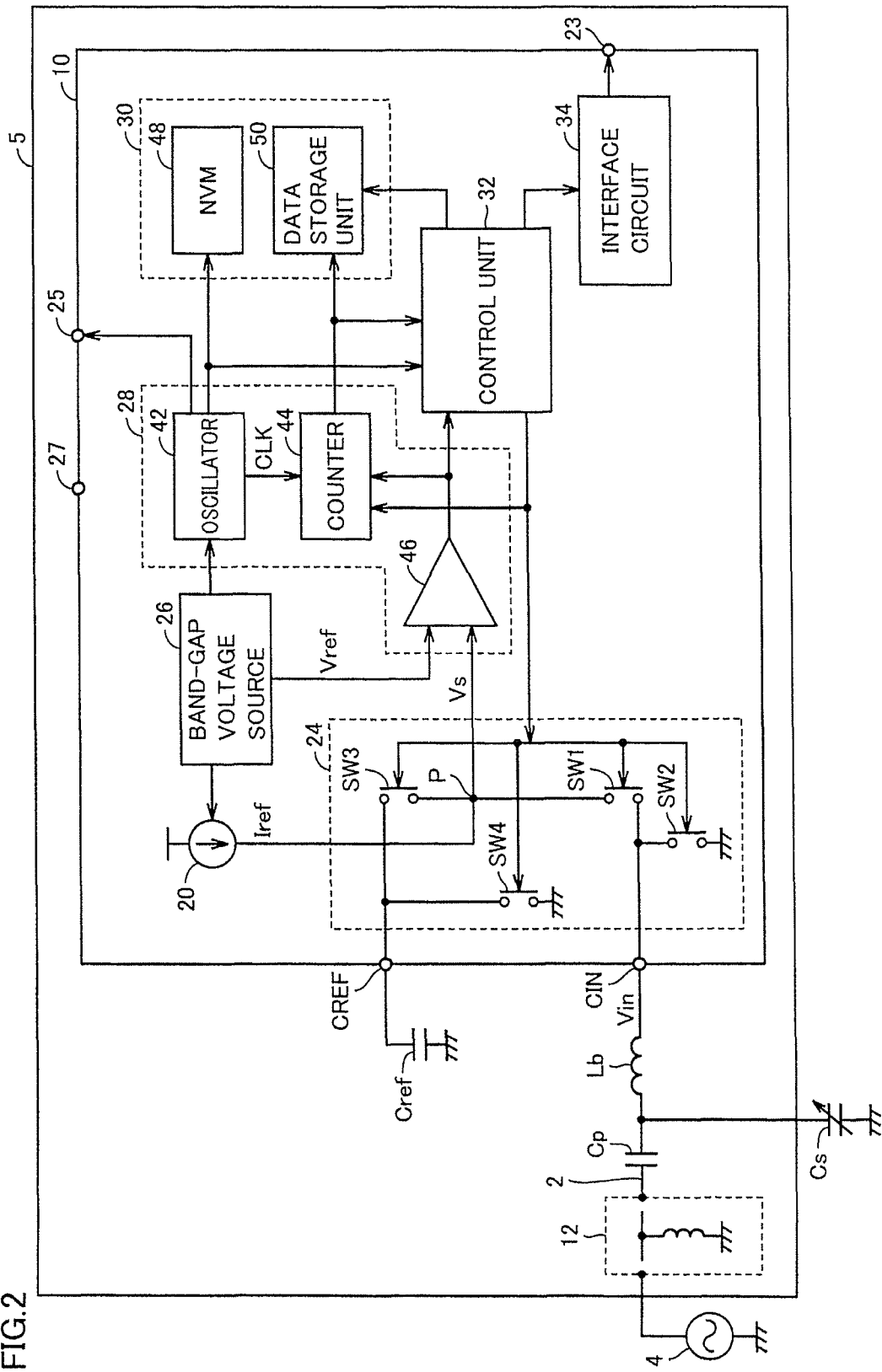
FIG. 2 is a block diagram showing a configuration of a capacitance detecting circuit in accordance with the first embodiment of the present invention.

FIG. 2 is a block diagram showing a configuration of a capacitance detecting circuit in accordance with the first embodiment of the present invention. Referring to FIG. 2, capacitance detecting circuit 10 includes a constant current source 20, terminals CREF, CIN, 23, 25 and 27, a charge/ discharge circuit 24, a band-gap voltage source 26, a time measuring circuit 28, a storage unit 30, a control unit 32, an an interface circuit 34.

Capacitance component Cp and object of detection Cs are electrically connected in parallel with terminal CIN. Reference capacitance element Cref is electrically connected to terminal CREF.

Charge/discharge circuit 24 connects capacitance component Cp and object of detection Cs to a voltage detection point P. Thus, capacitance component Cp and object of detection Cs are charged. At this time, charge/discharge circuit 24 discharges reference capacitance element Cref. Further, charge/discharge circuit 24 connects reference capacitance element Cref to voltage detection point P, to charge reference capacitance element Cref. At this time, charge/discharge circuit 24 discharges capacitance component Cp and object of detection Cs.

Specifically, charge/discharge circuit 24 includes switches SW1 to SW4. Each of switches SW1 to SW4 is controlled by control unit 32.

Switch SW1 has a first end connected to terminal CIN. Switch SW1 has a second end connected to voltage detection point P. Switch SW2 has a first end connected to terminal CIN. Switch SW2 has a second end grounded. Switch SW3 has a first end connected to terminal CREF. Switch SW3 has a second end connected to voltage detection point P. Switch SW4 has a first end connected to terminal CREF. Switch SW4 has a second end grounded.

Switches SW1 and SW4 turn on/off at the same timing. Switches SW2 and SW3 turn on/off at the same timing. Here, when switches SW1 and SW4 are on, switches SW2 and SW3 are off. In this case, a current Iref from constant current source 20 is output from terminal CIN through voltage detection point P and switch SW1. By the current output from terminal CIN, capacitance component Cp and object of detection Cs are charged. Further, reference capacitance element Cref is discharged. The current from reference capacitance element Cref flows through terminal CREF and switch SW4 to the ground node.

When switches SW1 and SW4 are off, switches SW2 and SW3 are on. In this case, the current Iref from constant current source 20 is output from terminal CREF through voltage detection point P and switch SW3. By the current output from terminal CREF, reference capacitance element Cref is charged. Further, capacitance component Cp and object of detection Cs are discharged. The current from capacitance component Cp and object of detection Cs flows through terminal CIN and switch SW2 to the ground node.

Time measuring circuit 28 measures the time of charge of a capacitance element or a capacitance component connected to voltage detection point P. In the present embodiment, the time of charge is defined to be the time period necessary for the voltage Vs of voltage detection point P to reach from 0 to the reference voltage Vref.

Time measuring circuit 28 includes an oscillator 42, a counter 44, and a comparator 46. Oscillator 42 generates a clock signal having a constant period.

Oscillator 42 is formed, for example of a CR oscillating circuit including a capacitor and a resistor.

In response to a signal input to oscillator 42, oscillator 42 can adjust its oscillation frequency. Terminal 25 is for measuring the oscillation frequency of oscillator 42 from the outside.

In response to the clock signal CLK from oscillator 42, counter 44 changes its count value. In order to turn on one of the switches SW1 and SW4, control unit 32 outputs a start signal. Counter 44 starts counting when the start signal becomes active.

Comparator 46 compares the voltage Vs with the reference voltage Vref. At a time point when voltage Vs attains to the reference voltage Vref, comparator 46 applies a stop signal to counter 44. Counter 44 stops counting when the stop signal becomes active.

Band-gap voltage source 26 generates a band-gap voltage, that is, a voltage stable against temperature change. Band-gap voltage source 26 supplies reference voltage Vref to comparator 46. Further, band-gap voltage source 26 supplies a voltage to constant current source 20 and oscillator 42.

Storage unit 30 includes a non-volatile memory (NVM) 48 and a data storage unit 50. Non-volatile memory 48 stores trimming codes. The trimming codes represent data for adjusting each of the oscillation frequency of oscillator 42 and the constant current Iref from constant current source 20 to a desired value. Terminal 27 is for adjusting the oscillation frequency and the constant current Iref from the outside.

Here, it is noted that input of trimming codes to terminal 27 is not limiting. By way of example, the trimming codes may be stored in non-volatile memory (NVM) 48 through interface circuit 34. In that case, it is possible for control unit 32 to read the trimming codes from non-volatile memory (NVM) 48 and to execute trimming.

Data storage unit 50 stores first data obtained in advance concerning the time it takes to charge the capacitance element having a known capacitance value to the prescribed value when the constant current is applied thereto. Data storage unit 50 stores the first data in association with the oscillation frequency of oscillator 42.

Data storage unit 50 further stores data, obtained in advance, concerning the time it takes to charge the capacitance component Cp to the prescribed value when the constant current is applied thereto, and data, obtained in advance, concerning the time it takes to charge the reference capacitance element Cref to the prescribed value when the constant current is applied thereto. These data are represented as count values of counter 44.

The count values stored in data storage unit 50 are obtained before module 5 is mounted on electronic equipment 1. The state in which module 5 is not yet mounted on electronic equipment 1 corresponds to the state in which object of detection Cs is not connected to signal line 2.

Control unit 32 calculates the capacitance value of object of detection Cs based on the data stored in data storage unit 50 and the measurements (count values) obtained by time measuring circuit 28. Specifically, control unit 32 realizes the "operation unit" of the capacitance detecting circuit in accordance with the present invention. The operation for calculating the capacitance value of object of detection Cs will be described in detail later.

Interface circuit 34 outputs a signal to the outside of capacitance detecting circuit 10, or receives a signal from the outside of capacitance detecting circuit 10. By way of example, a capacitance value calculated by control unit 32 is output from interface circuit 34. Further, terminal 23 outputs the clock signal CLK generated by oscillator 42 to the outside of capacitance detecting circuit 10.

Figure 3:
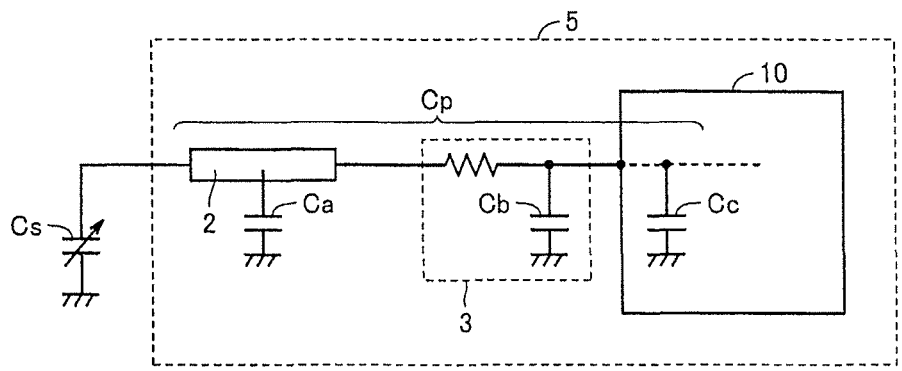
FIG. 3 shows a specific example of a capacitance component Cp.

Capacitance component Cp represents a capacitance element, a capacitance component or a combination thereof. FIG. 3 shows a specific example of capacitance component Cp.

Referring to FIG. 3, capacitance component Cp is formed, for example, by a plurality of parasitic capacitances. In the example shown in FIG. 3, capacitance component Cp includes capacitance components Ca, Cb and Cc. Capacitance component Ca represents parasitic capacitance of signal line 2. Capacitance component Cb represents capacitance element included in noise filter 3. Capacitance component Cc represents a capacitance component included in capacitance detecting circuit 10.

Figure 4:
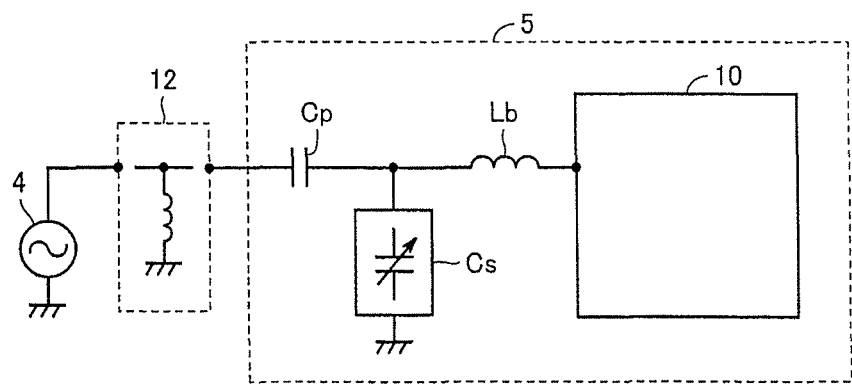
FIG. 4 shows another example of the module configuration.

The configuration of module 5 is not limited to those shown in FIGS. 1 and 2. FIG. 4 shows another example of the configuration of module 5. Referring to FIG. 4, object of detection Cs is included in module 5. Object of detection Cs is an element having correlation between the change in its characteristics and fluctuation of capacitance, such as a resonator. Further, matching circuit 12 is provided outside of module 5. As long as module 5 includes capacitance detecting circuit 10, module 5 may have a still different configuration.

In order to avoid complicated description, in FIGS. 3 and 4, reference capacitance element Cref is not shown.

Next, the method of detecting capacitance in accordance with an embodiment of the present invention will be described.

Generally, charges Q stored in a capacitance element, capacitance value C of the capacitance element and the voltage V of the capacitance element satisfy the relation of Q=CV. By differentiating both sides of this equation by time t, the following equation is obtained, where I represents current.

$$dQ/dt = I = C \times (dV/dt)$$

The equation above represents that the voltage increases in proportion to time, when the capacitance element is charged with a constant current.

Figure 5:
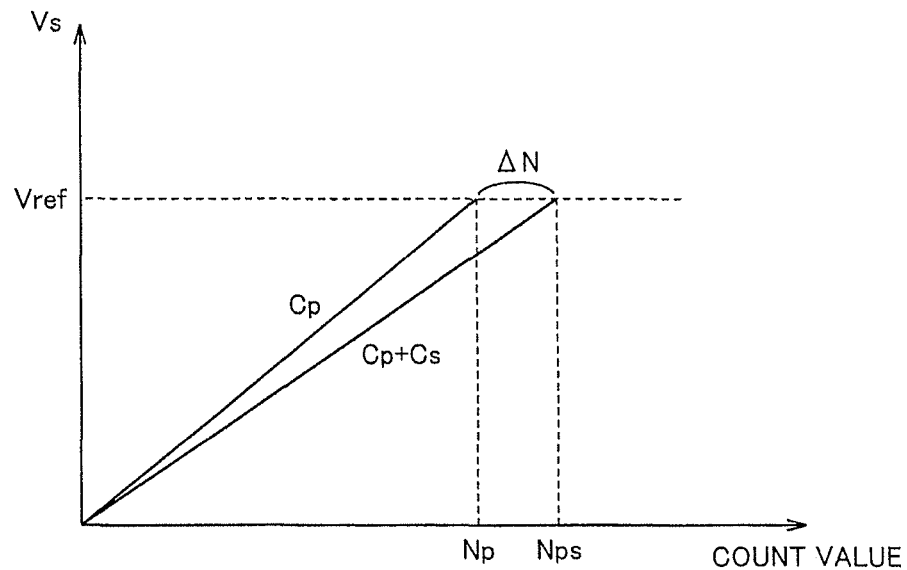
FIG. 5 shows a basic method of detecting capacitance in accordance with an embodiment of the present invention.

FIG. 5 shows a basic method of detecting capacitance in accordance with an embodiment of the present invention. Referring to FIG. 5, Cp and Cs represent the capacitance value of capacitance component Cp and capacitance value of object of detection Cs. When C=(Cp+Cs) and when C=Cp, count value until the voltage Vs of voltage detection point P attains to the voltage Vref is obtained. The count value changes in a prescribed period in proportion to the period of clock signal CLK.

Therefore, the time of charge is represented by a product of the count value and the prescribed period.

The count value when the voltage Vs reaches the voltage Vref depends on the magnitude of the capacitance value. When C=(Cp+Cs), the count value is Nps, and when C=Cp, the count value is Np. The value ΔN represents a difference between the count values Nps and Np. The value ΔN represents the time of charge corresponding to object of detection Cs.

A count value N0 of a capacitance element having a known capacitance value Ck is obtained in advance. From the relation Cs: Ck=ΔN: N0, the capacitance value of object of detection Cs can be calculated. In the present embodiment, the capacitance of the object of detection Cs can be detected through the following steps.

(1) Adjustment of capacitance detecting circuit;
(2) Adjustment of the module; and
(3) Mounting of the module on electronic equipment.

In the following, processes of respective steps will be described in greater detail.

(Adjustment of Capacitance Detecting Circuit)

Figure 6:
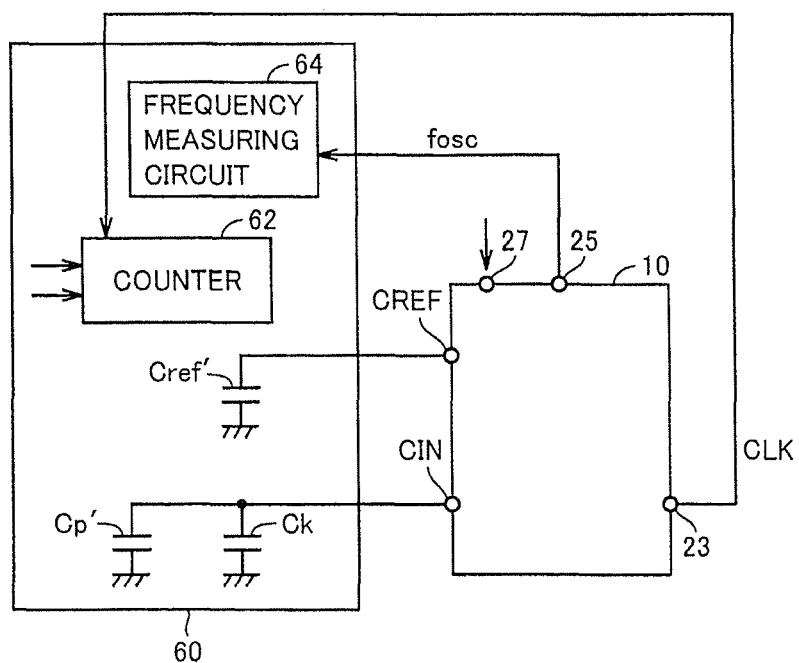
FIG. 6 is a circuit diagram related to adjustment of the capacitance detecting circuit.

FIG. 6 is a circuit diagram related to adjustment of the capacitance detecting circuit. Referring to FIG. 6, capacitance detecting circuit 10 is connected to a test board 60. Test board 60 includes capacitance elements Cref, Cp' and Ck, a counter 62, and a frequency measuring circuit 64. Capacitance elements Cp' and Ck are connected in parallel with terminal CIN of capacitance detecting circuit 10.

Capacitance element Cref is connected to terminal CREF of capacitance detecting circuit 10.

Capacitance values of capacitance elements Ck, Cp' and Cref are measured in advance. Elements having mutually equal capacitance are selected as capacitance components Cp' and Cref. By way of example, if the capacitance value of capacitance element Cref is determined in advance, a capacitance element having the capacitance value substantially equal to the capacitance value may be selected as capacitance element Cp'.

Capacitance detecting circuit 10 has terminals 23, 25 and 27. Terminal 23 outputs the clock signal CLK. Clock signal CLK is input to counter 62. Counter 62 starts counting in response to a start signal, and stops counting in response to a stop signal. Terminal 25 is connected to frequency measuring circuit 64. Terminal 27 receives the timing codes for adjusting the oscillation frequency.

Figure 7:
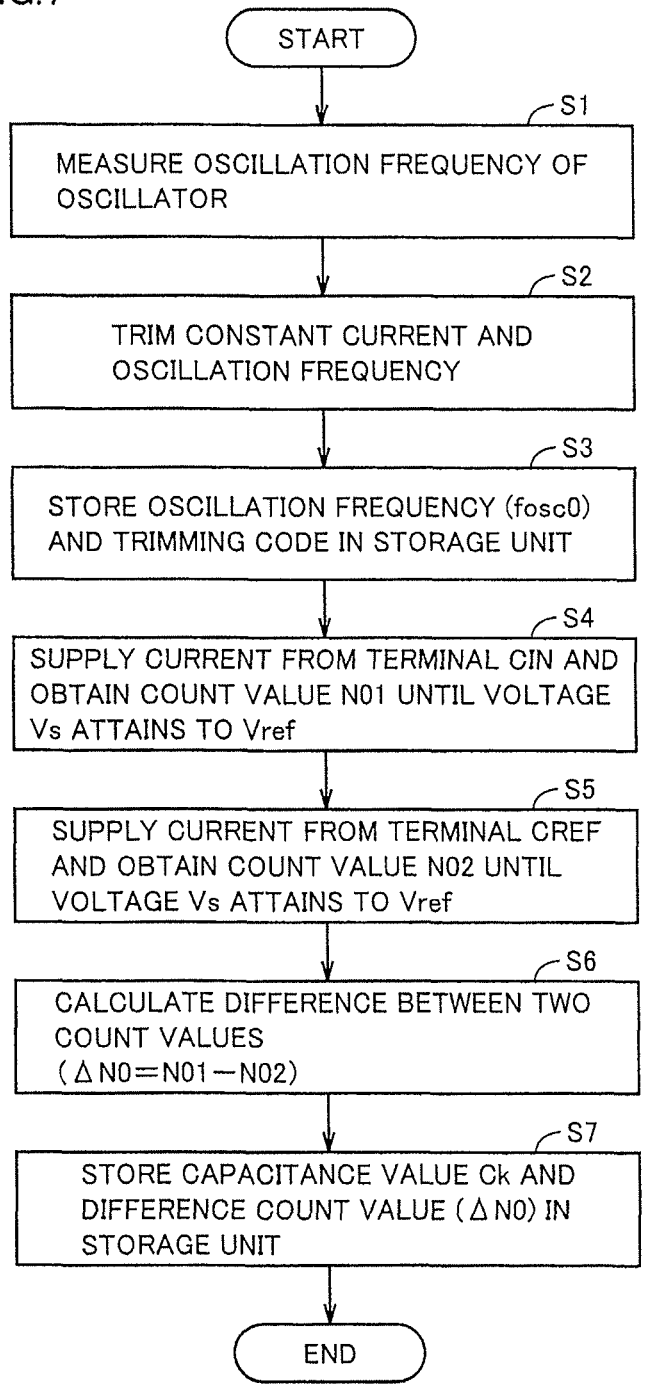
FIG. 7 is a flowchart representing adjustment of the capacitance detecting circuit.

FIG. 7 is a flowchart representing adjustment of the capacitance detecting circuit. Referring to FIGS. 6 and 7, at step SI, frequency measuring circuit 64 measures the oscillation frequency of the oscillator provided inside capacitance detecting circuit 10. At step S2, based on the measured oscillation frequency, trimming of current Iref from constant current source 20 (see FIG. 2) and of oscillation frequency fosc is executed. By the trimming, the value of current Iref is adjusted to a desired value and the oscillation frequency is adjusted to the initial frequency foscO.

Referring to FIGS. 2 and 7, at step S3, control unit 32 stores the oscillation frequency foscO and the trimming codes in storage unit 30 (non-volatile memory 48).

At step S4, capacitance detecting circuit 10 supplies the current Iref from terminal CIN to charge capacitance elements Cp' and Ck. Specifically, control unit 32 controls charge/discharge circuit 24 to turn on switches SW1 and SW4, and turns off switches SW2 and SW3. Time measuring circuit 28 generates a count value N01 until the voltage Vs reaches the reference voltage Vref Control unit 32 obtains the count value N01 from time measuring circuit 28.

At step S5, capacitance detecting circuit 10 supplies the current Iref from terminal CREF to charge capacitance element Cref. Specifically, control unit 32 controls charge/discharge circuit 24 to turn on switches SW2 and SW3, and turns off switches SW1 and SW4. Capacitance element Cref is charged, and capacitance elements Cp' and Ck are discharged. Time measuring circuit 28 generates a count value NO2 until the voltage Vs reaches the reference voltage Vref Control unit 32 obtains the count value NO2 from time measuring circuit 28. The processes of steps S4 and S5 may be executed in reverse order.

At step S6, control unit 32 calculates a difference ΔN0 between the two count values N01 and N02. The difference count value ΔN0 is calculated as ΔN0=N01−N02.

At step S7, control unit 32 stores the capacitance value of capacitance element Ck and the difference ΔN0 of the count value in storage unit 30 (data storage unit 50). In the following description, the capacitance value of capacitance element Ck is denoted as capacitance value Ck.

Capacitance elements Cp' and Cref have capacitance values equal to each other. Therefore, the difference between the sum of capacitance values Ck and Cp' and the capacitance value Cref is equal to the capacitance value Ck. By a separate measurement, the capacitance value Ck can be obtained precisely in advance. The difference count value ΔN0 is a count value representing the time of charge of capacitance element Ck.

By the process of steps S6 and S7, capacitance detecting circuit 10 stores the capacitance value Ck and the difference count value ΔN0 in association with each other.

Figure 8:
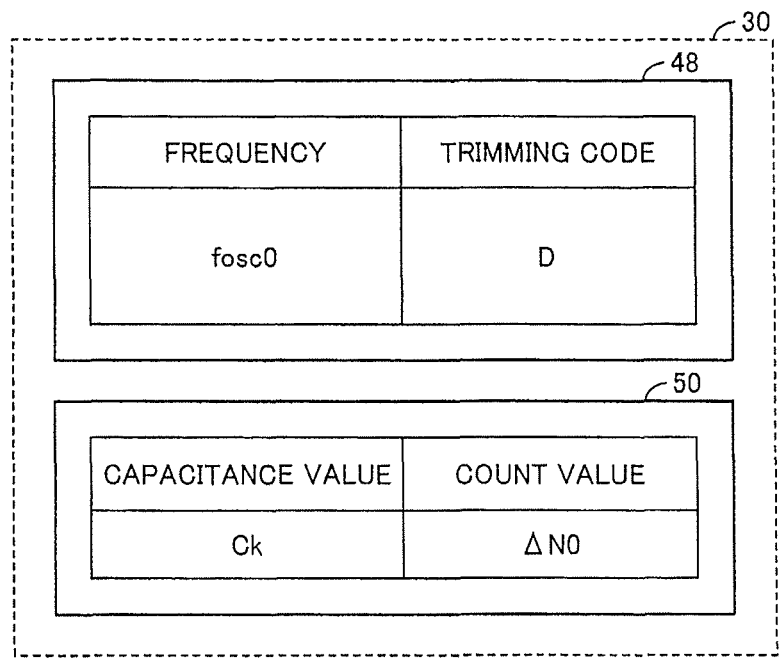
FIG. 8 shows data stored in a storage unit of the capacitance detecting circuit.

FIG. 8 shows data stored in the storage unit of the capacitance detecting circuit. Referring to FIG. 8, non-volatile memory 48 of storage unit 30 stores a frequency foscO in association with a trimming code D. Data storage unit 50 of storage unit 30 stores capacitance value Ck and difference count value ΔN0 in association with each other. The frequency foscO is the initial value of oscillation frequency.

(Adjustment of the Module)

Figure 9:
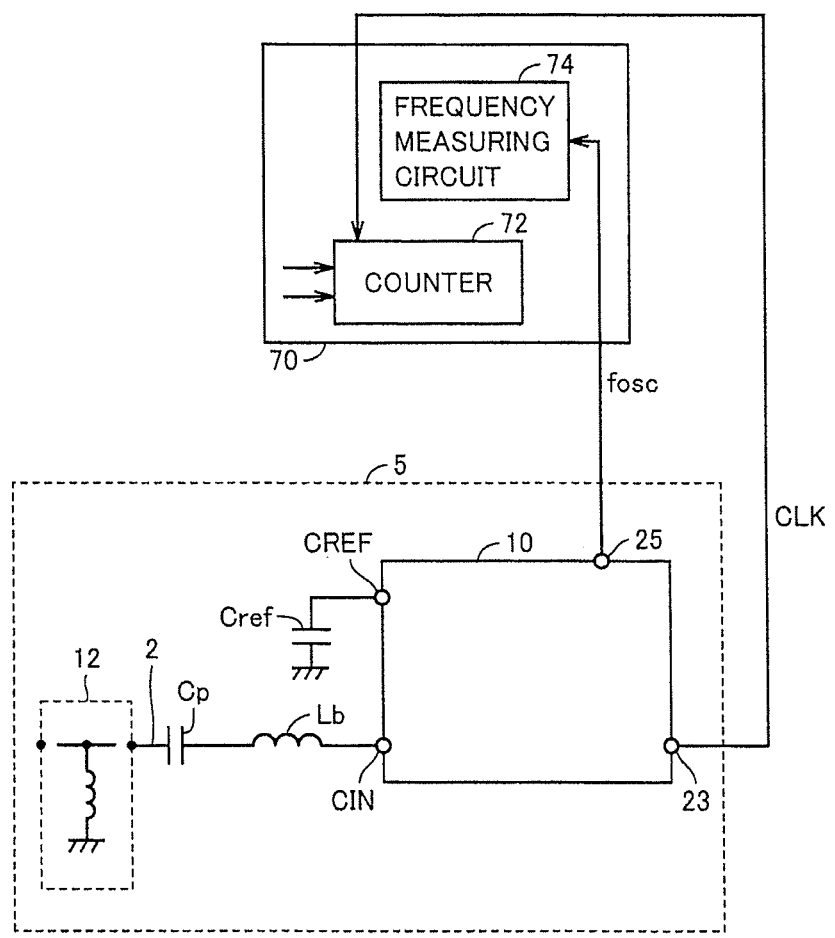
FIG. 9 is a circuit diagram related to adjustment of the module.

FIG. 9 is a circuit diagram related to adjustment of the module. Referring to FIG. 9, the module is connected to a test board 70. Test board 70 includes a counter 72 and a frequency measuring circuit 74. Clock signal CLK is output from terminal 23 of capacitance detecting circuit 10 and input to counter 72. Counter 72 starts counting in response to a start signal, and ends counting in response to a stop signal. Terminal 25 is connected to frequency measuring circuit 74. The oscillation frequency and constant current Iref have already been adjusted. Therefore, in FIG. 9, terminal 27 is not shown.

It is unnecessary that the capacitance values of capacitance component Cp and reference capacitance element Cref are known. Further, it is unnecessary that the capacitance value of capacitance component Cp is equal to the capacitance value of reference capacitance element Cref.

Figure 10:
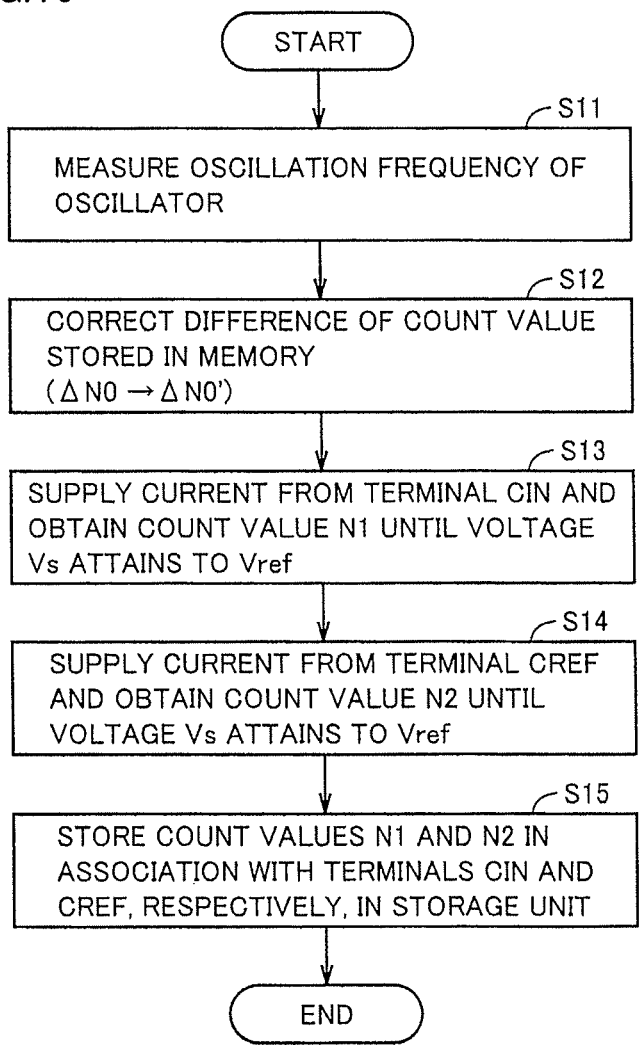
FIG. 10 is a flowchart representing adjustment of the module.

FIG. 10 is a flowchart representing adjustment of the module. Referring to FIGS. 9 and 10, at step SI 1, frequency measuring circuit 74 measures the oscillation frequency of the oscillator provided in capacitance detecting circuit 10.

Referring to FIGS. 2 and 10, at step S12, control unit 32 corrects the difference count value ΔN0 stored in storage unit 30 (data storage unit 50) based on the measured oscillation frequency. Control unit 32 corrects the difference count value ΔN0 and generates a difference count value ΔN0' in accordance with Equation (1) below.

$$\Delta NO' = \Delta N0 \times fosc/foscO \quad (1)$$

Control unit 32 updates the difference count value ΔN0 stored in data storage unit 50 to ΔNO'.

At step SI 3, capacitance detecting circuit 10 supplies the current Iref from terminal CIN to charge capacitance component Cp. Time measuring circuit 28 generates count value N1 until the voltage Vs reaches the reference voltage Vref. Control unit 32 obtains the count value N1 from time measuring circuit 28.

At step SI 4, capacitance detecting circuit 10 supplies the current Iref from terminal CREF to charge reference capacitance element Cref. Time measuring circuit 28 generates count value N2 until the voltage Vs reaches the reference voltage Vref. Control unit 32 obtains the count value N2 from time measuring circuit 28.

The processes of steps S13 and S14 are the same as those of steps S4 and S5, respectively, and, therefore, detailed description will not be repeated. The processes of steps S13 and S14 may be executed in reverse order.

At step SI 5, control unit 32 stores the count value N1 in association with terminal CIN, in storage unit 30 (data storage unit 50). Further, control unit 32 stores the count value N2 in association with terminal CREF in storage unit 30 (data storage unit 50).

Figure 11:
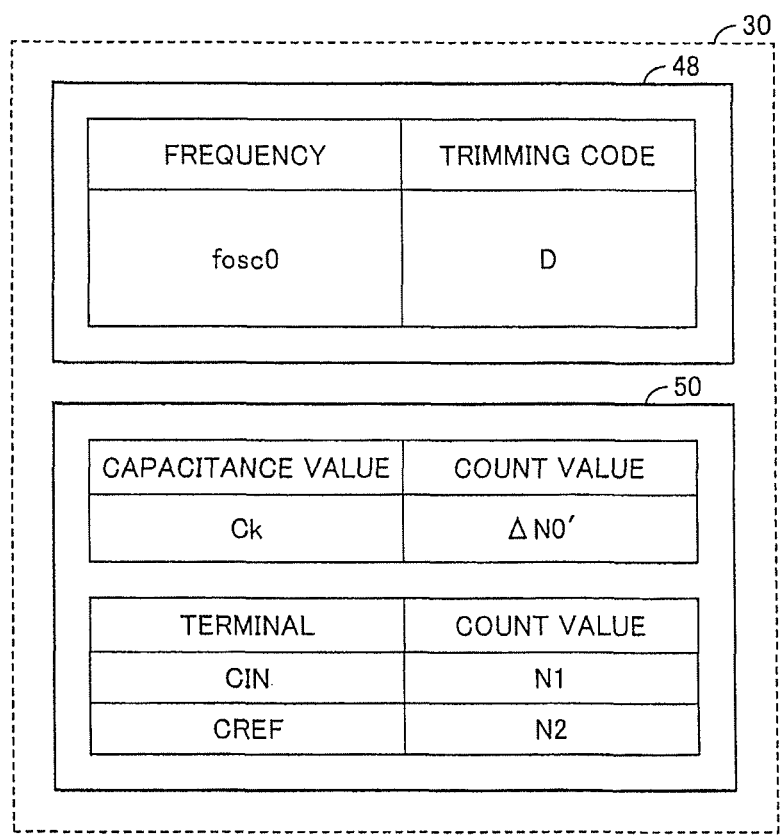
FIG. 11 shows data stored in the storage unit of the capacitance detecting circuit after adjustment of the module.

FIG. 11 shows data stored in the storage unit of the capacitance detecting circuit after adjustment of the module. Referring to FIG. 11, data storage unit 50 of storage unit 30 stores capacitance value Ck and difference count value ΔNO' in association with each other. Further, data storage unit 50 stores count values N1 and N2 in association with terminals CIN and CREF, respectively.

When capacitance detecting circuit 10 is mounted on module 5, the oscillation frequency of the oscillator may change. Therefore, at step SI 1, the oscillation frequency is measured.

The time of charge of capacitance element Ck does not change before and after the change of oscillation frequency of the oscillator. Therefore, the following relation is satisfied.

$$\Delta NO'/fosc = \Delta NO/fiscO$$

By modifying the equation above, Equation (1) is derived.

Count values N1 and N2 are used for detecting the capacitance value of object of detection Cs. The magnitude of parasitic capacitance may differ module by module. Therefore, capacitance component Cp may also differ module by module. The processes of steps S13 and S14 correspond to calibration of the module in consideration of variation in capacitance value of capacitance component Cp.

(Mounting of the Module on Electronic Equipment)

Figure 12:
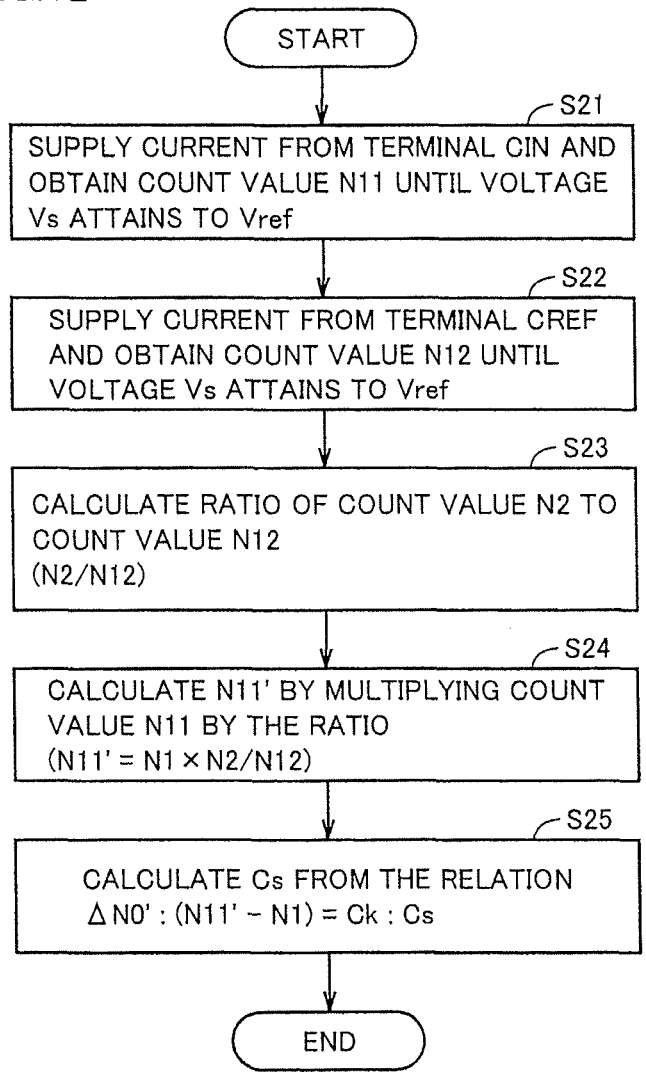
FIG. 12 is a flowchart representing detection of a capacitance value of an object of detection Cs.

FIG. 12 is a flowchart representing detection of the capacitance value of object of detection Cs. The process shown in FIG. 12 is executed at arbitrary timing (for example, at a constant period). Referring to FIGS. 2 and 12, at step S21, capacitance detecting circuit 10 supplies current Iref from terminal CIN to charge capacitance component Cp and object of detection Cs. Time measuring circuit 28 generates a count value Ni 1 until the voltage Vs reaches the reference voltage Vref. Control unit 32 obtains the count value Nl 1 from time measuring circuit 28.

At step S22, capacitance detecting circuit 10 supplies the current Iref from terminal CREF to charge reference capacitance element Cref. Time measuring circuit 28 generates a count value N12 until the voltage Vs reaches the reference voltage Vref. Control unit 32 obtains the count value N12 from time measuring circuit 28.

The processes of steps S21 and S22 are the same as those of steps S4 and S5, respectively, and, therefore, detailed description thereof will not be repeated. The processes of steps S21 and S22 may be executed in reverse order.

At step S23, control unit 32 calculates the ratio of count value N2 to count value N12, that is, N2/N12.

At step S24, control unit 32 calculates a count value N1 Γ by multiplying count value Nl 1 by the ratio (N2/N12). Specifically, count value N1 Γ is calculated in accordance with Equation (2) below.

$$Ni\ l' = N11 \times (N2/N12) \quad (2)$$

At step S25, control unit 32 calculates the capacitance value Cs in accordance with Equation (3) below.

$$\Delta NO' : (Nl\ l' - Nl) = Ck : Cs \quad (3)$$

Basically, the capacitance of capacitance component Cp does not change even when module 5 is mounted on electronic equipment 1. Count value Nl 1 represents the time of charge of capacitance component Cp and object of detection Cs, and count value Nl represents the time of charge of capacitance component Cp. Provided that the oscillation frequency fosc does not fluctuate before and after module 5 is mounted on electronic equipment 1, the count value that indicates the time of charge of object of detection Cs will be (Nl 1–Nl). Count value corresponding to the known capacitance value Ck is obtained in advance (difference count value ΔNO') in data storage unit 50. Therefore, if oscillation frequency fosc does not fluctuate, the capacitance value of object of detection Cs can be calculated from the relation Ck:Cs=ΔNO':(Nl 1–Nl).

Oscillation frequency fosc, however, may possibly fluctuate depending on temperature or other factors. Therefore, in the embodiment of the present invention, the count value Nl 1 is corrected in consideration of the fluctuation of oscillation frequency.

The capacitance value of reference capacitance element Cref does not change before and after module 5 is mounted on electronic equipment 1. Therefore, if the oscillation frequency fluctuates, the count value representing the time of charge of reference capacitance element Cref changes.

The ratio N2/N12 between count values N12 and N2 represents (oscillation frequency before module 5 is mounted on electronic equipment 1)/(oscillation frequency after module 5 is mounted on electronic equipment 1).

Difference count value (Nl Γ−Nl) and count value ΔNO' are both obtained based on the oscillation frequency before module 5 is mounted on electronic equipment 1. Therefore, capacitance value Cs is detected from the relation represented by Equation (3).

If the oscillation frequency is stable, the ratio between the count values N12 and N2 becomes closer to 1. In such a state, the processes of steps S14 and S22 to S24 may be omitted. In such a case, capacitance value Cs may be detected in accordance with Equation (4) below, at step S25.

$$\Delta NO':(Nl\ l-Nl)=Ck:Cs \qquad (4)$$

As described above, in accordance with the first embodiment, before the module is mounted on the electronic equipment, the count value corresponding to the capacitance component Cp of the module is obtained and the count value is stored.

As shown as an example in FIG. 3, capacitance component Cp may include the parasitic capacitance of the module. Therefore, the capacitance value of capacitance component Cp may differ module by module. Specifically, the capacitance value of capacitance component Cp may vary significantly module by module. Basically, however, the capacitance value of a capacitance component Cp of a certain module does not change before and after the module is mounted on electronic equipment. By the first embodiment, even if the capacitance value of capacitance component Cp differs module by module, the capacitance value of object of detection Cs can be detected with high accuracy.

Further, by the first embodiment, the count value (Ni 1) corresponding to the time of charge of the capacitance component Cp and object of detection Cs is corrected. It is possible that the oscillation frequency fluctuates depending on temperature or other factors. By the first embodiment, the capacitance value of object of detection Cs can be detected with high accuracy regardless of the fluctuation in oscillation frequency.

Embodiment 2

Figure 13:
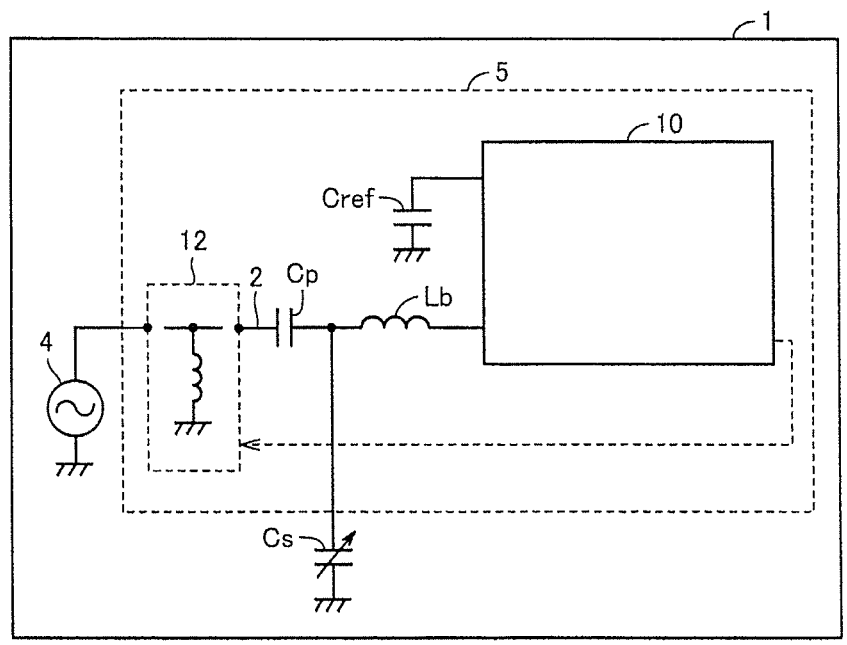
FIG. 13 is a block diagram showing a schematic configuration of electronic equipment mounting a module in accordance with a second embodiment of the present invention.

FIG. 13 is a block diagram showing a schematic configuration of electronic equipment mounting a module in accordance with a second embodiment of the present invention. Referring to FIG. 13, capacitance detecting circuit 10 detects the capacitance value Cs and applies a control signal in accordance with the detected capacitance value Cs to matching circuit 12. Thus, capacitance detecting circuit 10 controls matching circuit 12. As described above, matching circuit 12 includes a variable capacitance element. By way of example, the control signal is used for changing the capacitance value of a variable capacitance element.

The second embodiment is not limited the configuration in which capacitance detecting circuit 10 directly controls matching circuit 12. For example, module 5 may include a control circuit for controlling matching circuit 12 in accordance with a control signal output from capacitance detecting circuit 10.

The configuration of capacitance detecting circuit 10 is basically the same as that shown in FIG. 2. Storage unit 3 stores a table defining the relation between the detected capacitance value and the types of control signals. Except for this point, the configuration of other portions of capacitance detecting circuit 10 is the same as that shown in FIG. 2 and, therefore, detailed description will not be repeated.

FIG. 14 shows a configuration of a storage unit of capacitance detecting circuit 10 in accordance with the second embodiment of the present invention. Referring to FIGS. 11 and 14, in the second embodiment, tables 48a and 48b are stored in nonvolatile memory 48 in storage unit 30. The number of tables is not specifically limited.

In table 48a, the range of capacitance value Cs and the types of control signals correspond to each other. For example, capacitance detecting circuit 10 has two channels for outputting control signals. If capacitance value Cs is smaller than CO, for instance, the first and second channels (channel 1, channel 2) correspond to control signals SPIla and SPI2a, respectively.

Control unit 32 shown in FIG. 2 specifies the type of control signal corresponding to the detected capacitance value Cs, by looking up the table. Control unit 32 generates a control signal of the specified type. The generated control signal is output from interface circuit 34 (see FIG. 2). An external device may access to interface circuit 34 to read the control signal.

As described above, according to the second embodiment, control in accordance with the detected capacitance becomes possible. This improves convenience for the user.

In the embodiments described above, the difference count value ΔN0 corresponds to first data obtained in advance as the time of charge of a capacitance element having a known capacitance value (Ck). The count value Nl corresponds to the second data obtained in advance as the time of charge of capacitance component Cp. The difference count value (Nl Γ−Nl) corresponds to the third data indicating the time of charge of object of detection Cs. Count value N2 corresponds to the fourth data obtained in advance as the time of charge of reference capacitance element Cref.

Count value Ni 1 corresponds to the first measurement value of time measuring circuit 28. Count value N12 corresponds to the second measurement value of time measuring circuit 28.

Although the present invention has been described and illustrated in detail, it is clearly understood that the same is by way of illustration and example only and is not to be taken by way of limitation, the scope of the present invention being interpreted by the terms of the appended claims.

The invention claimed is:

1. A module, comprising:
(a) a current path connected to an object of detection and including a capacitance component; and
(b) a capacitance detecting circuit supplying a constant current to said object of detection through said current path, for determining a capacitance value of said object of detection, said capacitance value detecting circuit including:
(1) a constant current source supplying said constant current to a voltage detection point;
(2) a storage unit storing: (a) first data, obtained in advance of said determination of said capacitance value, concerning a time it takes to charge a capacitance element having a known capacitance value to said prescribed voltage when said constant current is applied to said capacitance element and (b) second data, obtained in advance of said detection of said capacitance value, concerning a time it takes to charge said capacitance component to said prescribed voltage when said constant current is applied to said capacitive component;

(3) a charge/discharge circuit connecting said current path to said voltage detection point to charge both said object of detection and said capacitance component, and disconnecting said current path from said voltage detection point to discharge both said object of detection and said capacitance component;

(4) a time measuring circuit generating a third data indicative of a time it takes to charge said object of detection and said capacitance component with said constant current to cause said voltage detection point to attain said prescribed voltage; and (5) an operation unit:
(a) generating fourth data representing a time it takes to charge said object of detection from a difference between said third data and said second data; and
(b) calculating a capacitance value of said object of detection based on a ratio between said third data and said first data.

2. The module according to claim 1, wherein:
said time measuring circuit includes an oscillator and a counter responsive to an output signal from said oscillator, for generating a count value as said third data;
said storage unit stores, in advance of said detection of said capacitance value, an initial value of oscillation frequency of said oscillator and an initial value of said first data; and
said operation unit corrects said initial value of said first data in accordance with a ratio between said initial value of said oscillation frequency and a measured value of said oscillation frequency, to update said first data.

3. The module according to claim 1, further comprising a reference capacitance element and wherein:
said charge/discharge circuit connects said reference capacitance element to said voltage detection point to charge said reference capacitance element;
said charge/discharge circuit disconnects said reference capacitance element from said voltage detection point to discharge said reference capacitance element;
said time measuring circuit measures a time it takes to charge said reference capacitance element to said prescribed voltage when it is connected to said voltage detection point and supplied with said constant current to output a second measurement value;
said storage unit stores fifth data, obtained in advance of said detection of said capacitance value, indicating said time it takes to charge said reference capacitance element to said prescribed voltage; and
said operation unit corrects said first measurement value based on a ratio between said second measurement value and said fifth data.

4. The module according to claim 1, wherein;
said storage unit stores a relationship between information indicating types of control signals and the capacitance value of said object of detection;
said operation unit generates a control signal based on said calculated capacitance value and said relationship stored in said storage unit; and
said capacitance detecting circuit further includes an interface circuit for outputting said calculated capacitance value and said control signal.

5. The module according to claim 1, wherein said object of detection and said capacitance component are in electrically parallel legs of said current path.

6. The module according to claim 1, wherein:
said time measuring circuit includes an oscillator and a counter responsive to an output signal from said oscillator, for generating a count value as said third data;
said storage unit stores, in advance of said detection of said capacitance value, an initial value of oscillation frequency of said oscillator and an initial value of said first data; and
said operation unit corrects said initial value of said first data in accordance with a ratio between said initial value of said oscillation frequency and a measured value of said oscillation frequency, to update said first data.

7. The module according to claim 6, wherein;
said storage unit stores a relationship between information indicating types of control signals and the capacitance value of said object of detection;
said operation unit generates a control signal based on said calculated capacitance value and said relationship stored in said storage unit; and
said capacitance detecting circuit further includes an interface circuit for outputting said calculated capacitance value and said control signal.

8. The module according to claim 6, further comprising a reference capacitance element and wherein:
said charge/discharge circuit connects said reference capacitance element to said voltage detection point to charge said reference capacitance element;
said charge/discharge circuit disconnects said reference capacitance element from said voltage detection point to discharge said reference capacitance element;
said time measuring circuit measures a time it takes to charge said reference capacitance element to said prescribed voltage when it is connected to said voltage detection point and supplied with said constant current to output a second measurement value;
said storage unit stores fifth data, obtained in advance of said detection of said capacitance value, indicating said time it takes to charge said reference capacitance element to said prescribed voltage; and
said operation unit corrects said first measurement value based on a ratio between said second measurement value and said fifth data.

9. The module according to claim 8, wherein;
said storage unit stores a relationship between information indicating types of control signals and the capacitance value of said object of detection;
said operation unit generates a control signal based on said calculated capacitance value and said relationship stored in said storage unit; and
said capacitance detecting circuit further includes an interface circuit for outputting said calculated capacitance value and said control signal.

10. A capacitance detecting method of determining a capacitance value of an object of detection connected to a current path including a capacitance component comprising:
supplying a constant current to a voltage detection point;
storing: (a) first data, obtained in advance of said determination of said capacitance value, concerning a time it takes to charge a capacitance element having a known capacitance value to said prescribed voltage when said constant current is applied to said capacitance element and (b) second data, obtained in advance of said detection of said capacitance value, concerning a time it takes to charge said capacitance component to said prescribed voltage when said constant current is applied to said capacitive component;

connecting said current path to said voltage detection point to charge both said object of detection and said capacitance component, and subsequently disconnecting said current path from said voltage detection point to discharge both said object of detection and said capacitance component;

generating a third data indicative of a time it takes to charge said object of detection and said capacitance component with said constant current to cause said voltage detection point to attain said prescribed voltage;

generating fourth data representing a time it takes to charge said object of detection from a difference between said third data and said second data; and calculating a capacitance value of said object of detection based on a ratio between said third data and said first data.

11. The capacitance detecting method according to claim 10, wherein said third data is generated using an oscillator and a counter to generate a count value in response to an output signal from said oscillator and said capacitance detecting method further comprises:

storing, in advance of said detection of said capacitance value, an initial value of an oscillation frequency of said oscillator and an initial value of said first data; and correcting said initial value of said first data in accordance with a ratio between said initial value of said oscillation frequency and a measured value of said oscillation frequency.

12. The capacitance detecting method according to claim 10, further comprising:

supplying said constant current to said voltage detection point to charge said reference capacitance element; and measuring a time it takes to charge said reference capacitance element to said prescribed voltage when it is supplied with said constant current to generate a second measurement value; and wherein:

said act of generating said third data includes correcting said first measurement value based on a ratio between said second measurement value and said fourth data; and said act of generating said third data includes the act of correcting said first measurement value based on a ratio between said second measurement value and said fourth data.

13. The capacitance detecting method according to claim 10, further comprising:

storing a relationship between information indicating types of control signals and the capacitance value of said object of detection;

generating a control signal based on said calculated capacitance value and said relationship stored in said storage unit; and outputting said calculated capacitance value and said control signal.

14. The capacitance detecting method of claim 10, wherein said object of detection and said capacitance component are in electrically parallel legs of a current path when they are charged by said constant current to generate said third data.

* * * * *